US012015061B2

(12) United States Patent
Lim et al.

(10) Patent No.: US 12,015,061 B2
(45) Date of Patent: Jun. 18, 2024

(54) RADIO FREQUENCY SWITCH

(71) Applicant: Samsung Electro-Mechanics Co., Ltd., Suwon-si (KR)

(72) Inventors: Jongmo Lim, Suwon-si (KR); Wonsun Hwang, Suwon-si (KR); Byeonghak Jo, Suwon-si (KR); Yoosam Na, Suwon-si (KR); Youngsik Hur, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 455 days.

(21) Appl. No.: 17/168,531

(22) Filed: Feb. 5, 2021

(65) Prior Publication Data
US 2021/0408248 A1 Dec. 30, 2021

(30) Foreign Application Priority Data

Jun. 30, 2020 (KR) ........................ 10-2020-0080205

(51) Int. Cl.
*H01L 27/02* (2006.01)
*H01L 29/417* (2006.01)
*H03K 17/081* (2006.01)

(52) U.S. Cl.
CPC .... *H01L 29/41758* (2013.01); *H01L 27/0207* (2013.01); *H03K 17/08104* (2013.01)

(58) Field of Classification Search
CPC ........... H03K 17/6871; H03K 17/6872; H03K 17/6874; H03K 17/693; H01L 29/66431; H01L 29/66462; H01L 29/778–7789; H01L 23/66

See application file for complete search history.

(56) References Cited

U.S. PATENT DOCUMENTS

| 9,484,973 | B1 | 11/2016 | Carroll et al. | |
|---|---|---|---|---|
| 9,923,594 | B2 | 3/2018 | Madan et al. | |
| 10,587,233 | B2 | 3/2020 | Hurwitz et al. | |
| 10,622,992 | B2 | 4/2020 | Englekirk | |
| 2006/0219534 | A1* | 10/2006 | Matsuda | H01L 29/7787 257/E27.06 |
| 2008/0174357 | A1* | 7/2008 | Matsuda | H03K 17/693 327/427 |
| 2011/0233677 | A1* | 9/2011 | Yamamoto | H01L 27/027 257/E27.06 |
| 2012/0154018 | A1* | 6/2012 | Sugiura | H03K 17/693 327/427 |
| 2015/0129965 | A1* | 5/2015 | Roy | H01L 29/41758 257/347 |
| 2015/0372085 | A1* | 12/2015 | Lee | H01L 29/4238 257/288 |
| 2017/0053938 | A1* | 2/2017 | Whitefield | H01L 29/41733 |
| 2018/0358964 | A1* | 12/2018 | Seki | H01L 27/0629 |

* cited by examiner

*Primary Examiner* — Eric A. Ward
(74) *Attorney, Agent, or Firm* — NSIP Law

(57) ABSTRACT

A radio frequency (RF) switch is provided. The RF switch is configured to switch a RF signal input to a first terminal. The RF switch includes a first transistor, disposed at a first distance from the first terminal, and configured to switch the RF signal, and a second transistor, disposed at a second distance from the first terminal, and configured to switch the RF signal. The first distance is shorter than the second distance, and a number of first contact vias formed in a first electrode in the first transistor is greater than a number of second contact vias formed in a second electrode of the second transistor.

14 Claims, 13 Drawing Sheets

RADIO FREQUENCY SWITCH

CROSS-REFERENCE TO RELATED APPLICATION(S)

This application claims the benefit under 35 USC § 119(a) of Korean Patent Application No. 10-2020-0080205 filed on Jun. 30, 2020 in the Korean Intellectual Property Office, the entire disclosure of which is incorporated herein by reference, for all purposes.

BACKGROUND

1. Field

The following description relates to a radio frequency (RF) switch.

2. Description of Related Art

A radio frequency (RF) switch is an element that is widely used in a transmission end and a receiving end of a communication module, and is implemented to transmit an RF signal, or bypass the RF signal to ground. Additionally, the RF switch may also fluctuate a use frequency of an antenna, and the RF switch is connected between the antenna and the impedance element to switch the connection of the impedance element to the antenna.

Such an RF switch has an important withstand voltage characteristic to withstand the high power of the RF signal. When the RF switch is in the off state, a high voltage is applied, which may cause the linearity of the RF switch to collapse and physical destruction thereof. Since the voltage that the switch in the off state can withstand is limited, in order to prevent breakdown of the RF switch, a method of coupling of transistors of several stages in series is used in the RF switch. When the RF switch is implemented by using multiple transistors in series, a voltage distributed to one transistor is decreased, thereby preventing breakdown of the RF switch.

The breakdown of the RF switch occurs even when the voltage is distributed to only a specific one of the transistors of several stages, and thus more transistors can be coupled in series to solve such a problem. However, when multiple transistors are used, the characteristic of the on-state of the RF switch may be deteriorated. To compensate for this, the total width of the transistor may be increased. However, this may result in an increase in the size of an integrated circuit.

The above information disclosed in this Background section is only for enhancement of understanding of the background of the invention, and therefore it may contain information that does not form the prior art that is already known in this country to a person of ordinary skill in the art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a radio frequency (RF) switch configured to switch a RF signal input to a first terminal, the RF switch includes a first transistor, disposed at a first distance from the first terminal, and configured to switch the RF signal; and a second transistor, disposed at a second distance from the first terminal, and configured to switch the RF signal, wherein the first distance is shorter than the second distance, and wherein a number of first contact vias formed in a first electrode in the first transistor is greater than a number of second contact vias formed in a second electrode of the second transistor.

The first electrode may be one of a drain electrode and a source electrode of the first transistor, and the second electrode may be one of a drain electrode and a source electrode of the second transistor.

The first contact via may be a via that connects the first electrode and a doping area of the first transistor, and the second contact via may be a via that connects the second electrode and a doping area of the second transistor.

A width of the first electrode may be larger than a width of the second electrode.

A distance between the first electrode and a control electrode of the first transistor may be shorter than a distance between the second electrode and a control electrode of the second transistor.

An area of the first contact via may be larger than an area of the second contact via.

The first transistor and the second transistor may have a structure in which the first terminal and a second terminal of the RF switch are stacked.

An impedance value that corresponds to the first transistor when the first transistor is turned off, may be smaller than an impedance value that corresponds to the second transistor when the second transistor is turned off.

In a general aspect, a radio frequency (RF) switch configured to switch between a first terminal and a second terminal, the RF switch includes a first transistor, disposed at a first distance from the first terminal, and including a first control electrode to which a switching signal is applied; and a second transistor, disposed at a second distance from the first terminal, and including a second control electrode to which the switching signal is applied, wherein the first distance is shorter than the second distance, and a third distance between a first electrode of the first transistor and the first control electrode is shorter than a fourth distance between a second electrode of the second transistor and the second control electrode.

The first electrode may be at least one of a drain electrode and a source electrode of the first transistor, and the second electrode may be at least one of a drain electrode and a source electrode of the second transistor.

The third distance may be a distance from a contact point of the first electrode and a doping area of the first transistor to the first control electrode, and the fourth distance is a distance from a contact point of the second electrode and a doping area of the second transistor to the second control electrode.

The third distance may be a spatial distance between the first electrode and the first control electrode, and the fourth distance may be a spatial distance between the second electrode and the second control electrode.

A width of the first electrode may be larger than a width of the second electrode.

A number of contact vias formed in the first electrode may be greater than a number of contact vias formed in the second electrode.

The first transistor and the second transistor may be coupled in series between the first terminal and the second terminal.

An impedance value corresponding to the first transistor when the first transistor is turned off may be smaller than an impedance value corresponding to the second transistor when the second transistor is turned off.

An RF signal may be applied to the first terminal and the second terminal is connected to ground.

An RF signal may be applied to the first terminal and the second terminal is connected to an impedance element configured to provide an impedance value to an antenna.

In a general aspect, a radio frequency (RF) switch includes a first transistor, disposed at a first distance from a RF input signal, and a second transistor, disposed at a second distance from the RF input signal, wherein a total number of first contact vias formed in a first electrode in the first transistor is greater than a total number of second contact vias formed in a second electrode of the second transistor.

A width of the first electrode may be larger than a width of the second electrode.

Other features and aspects will be apparent from the following detailed description, the drawings, and the claims.

Figure 1A:
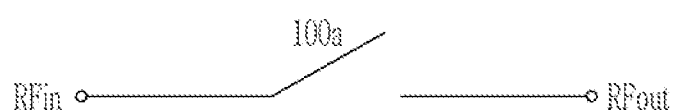
FIG. 1A to FIG. 1C respectively illustrate positions of example RF switches, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

FIG. 1A to FIG. 10 respectively illustrate positions of example RF switches, in accordance with one or more embodiments.

Referring to FIG. 1A, an RF switch 100*a* may be implemented on an RF signal line to switch transmission of an RF signal. The RF switch 100*a* is connected between an input terminal RFin to which the RF signal is input, and an output terminal RFout to which the RF signal is output, and may switch transmission of the RF signal between the two terminals RFin and RFout. Hereinafter, the terminal RFin to which the RF signal is input is called an RF signal input terminal Rin, and the terminal RFout to which the RF signal is output is called an RF signal output terminal Rout.

Figure 1B:
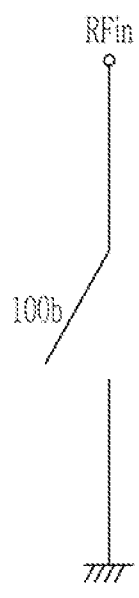
Figure 1C:
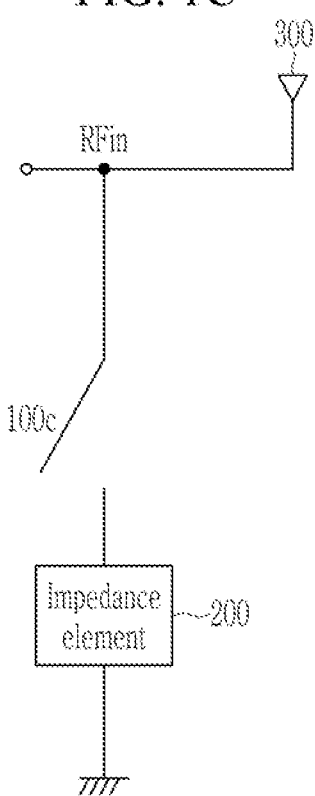

Referring to FIG. 1B, an RF switch 100b may be connected between the RF signal input terminal RFin and the ground to bypass the RF signal to the ground. The RF switch 100b may bypass the RF signal to the ground when being bypassed.

In an example, the RF switch 100a of FIG. 1A and the RF switch 100b of FIG. 1B may be used together. When the RF switch 100a is turned on, the RF switch 100b is turned off, and thus the RF signal may be output. Additionally, when the RF switch 100b is turned off, the RF switch 100b is turned on and thus the RF signal may be bypassed to the ground.

Figure 10:
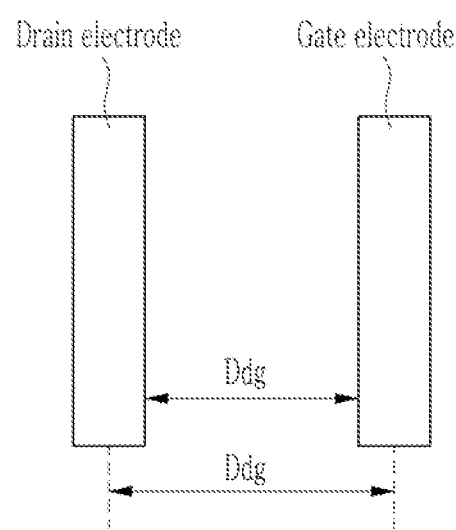
FIG. 10 illustrates a gap between a drain electrode and a gate electrode, in accordance with one or more embodiments.

Referring to FIG. 10, an RF switch 100c may be connected between an antenna 300 and an impedance element 200 for fluctuating impedance of the antenna 300. That is, a first end of the RF switch 100c may be connected to the RF signal input terminal RFin and the antenna 300, and the impedance element 200 may be connected between a second end of the RF switch 100c and the ground. The impedance element 200 may include at least one of a resistor, a capacitor, and an inductor. When the RF switch 100c is turned on, the impedance of the antenna 300 is fluctuated by the impedance element 200, and thus the antenna 300 can support various frequency bands. That is, depending on whether or not the RF switch 100c is turned on, a frequency band that can be supported by the antenna 300 can be changed.

As described, the RF switch, in accordance with one or more embodiments, can be located at various positions in a communication module.

Hereinafter, an example in which the RF switch is located in the position as shown in FIG. 1B is illustrated for convenience. However, the examples may be applied to an RF switch that is located at other positions. Additionally, RF switch 1000, as illustrated in FIG. 2, may be used as a reference numeral of the RF switch, in accordance with one or more embodiments.

Figure 2:
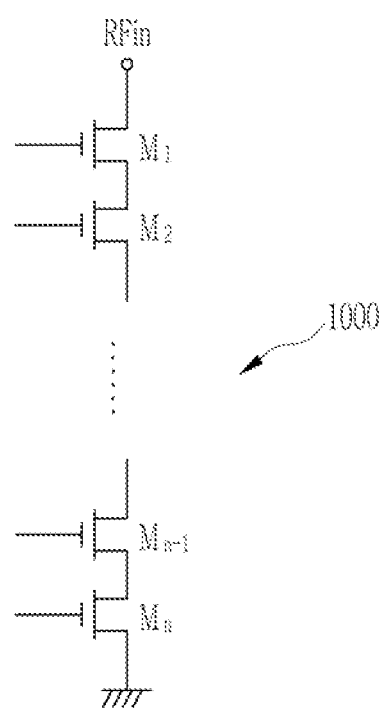
FIG. 2 illustrates an example RF switch 1000, in accordance with one or more embodiments.

FIG. 2 illustrates an example RF switch 1000, in accordance with one or more embodiments.

As illustrated in FIG. 2, an RF switch 1000, in accordance with one or more embodiments, may include a plurality of transistors M1, M2, . . . , Mn-1, and Mn, and the plurality of transistors M1, M2, . . . , Mn-1, and Mn may be coupled in series. That is, the RF switch 1000, in accordance with one or more embodiments, may have a structure in which the plurality of transistors M1, M2, . . . , Mn-1, and Mn are stacked. A drain of a transistor M1 may be connected to the RF signal input terminal RFin, a drain of a transistor M2 may be connected to a source of the transistor M1, and a drain of a transistor Mn may be connected to a source of a transistor Mn-1. Additionally, a switching control signal (i.e., a turn-on signal or a turn-off signal) may be applied to gates of the plurality of transistors M1, M2, . . . , Mn-1, and Mn. Here, the plurality of transistors M1, M2, . . . , Mn-1, and Mn may be field effect transistors (FET), metal oxide semiconductor field effect transistors (MOSFETs), and the like. In such a structure, although a high voltage is applied to the RF switch 1000 when the RF switch 1000 is turned off, a voltage can be distributed to each of the plurality of transistors M1, M2, . . . , Mn-1, and Mn. The breakdown of the RF switch 1000 can be prevented by such voltage distribution.

Here, there may be a problem in that the voltage of the RF signal is not equally distributed to each of the plurality of transistors M1, M2, . . . , Mn-1, and Mn. A transistor has parasitic capacitance when being turned off, and each of the plurality of transistors M1, M2, . . . , Mn-1, and Mn may have a different parasitic capacitance value. For example, a parasitic capacitance value of the transistor M1 and a parasitic capacitance value of the transistor M2 may be different from each other.

Figure 3A:
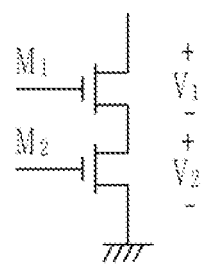
FIG. 3A illustrates an example that the an RF switch 1000 is formed of two transistors.
Figure 3B:
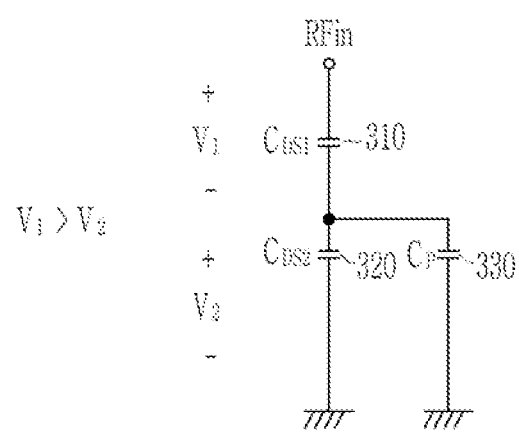
FIG. 3B illustrates capacitance generated when the two transistors in FIG. 3A are turned off, in accordance with one or more embodiments.

Due to such a difference in the parasitic capacitance, voltages of the plurality of transistors M1, M2, . . . , Mn-1, and Mn may be changed. Referring to FIG. 3A and FIG. 3B, capacitance and a distribution voltage seen in each transistor when the RF switch 1000 is formed of two transistors M1 and M2 will now be described.

FIG. 3A illustrates an example in which the RF switch 1000 is formed of two transistors. Additionally, FIG. 3B illustrates capacitance generated when the two transistors in FIG. 3A are turned off.

Referring to FIG. 3A, when the RF switch 1000 is turned off, a voltage at drain and source electrodes of the transistor M1 is denoted as V1, and a voltage at drain and source electrodes of the transistor M2 is denoted as V2. V1 and V2 are called distribution voltages.

Referring to FIG. 3B, a capacitance CDS1 310 indicates capacitance generated between a drain and a source of the transistor M1 when the RF switch 1000 is turned off. A capacitance CDS2 320 indicates capacitance generated between a drain and a source of the transistor M2 when the RF switch 1000 is turned off. Additionally, a parasitic capacitance CP 330 indicates parasitic capacitance generated between the drain of the transistor M1 and a substrate. Since the source of the transistor M2 is connected to the ground, parasitic capacitance may not be generated between the source M2 of the transistor M2 and the substrate. On the contrary, the source of the transistor M1 is not connected to the ground, and thus parasitic capacitance is generated between the source of the transistor M1 and the substrate. In an example, the substrate indicates a silicon substrate of each transistor that forms the RF switch 1000.

Accordingly, the voltage V1 at the transistor M1 and the voltage V2 at the transistor M2 may be different from each other. Assuming that the capacitance CDS1 and the capacitance CDS2 have the same value, a parasitic capacitance Cp may be added to the capacitance seen in the transistor M2. An impedance value for the capacitance is as given in Equation 1 below.

$$Z = \frac{1}{2\pi fc} \quad \text{Equation 1}$$

Accordingly, the impedance value of the transistor M1 has a higher value than the impedance value of the transistor M2. Accordingly, the voltage V1 at the transistor M1 may be higher than the voltage V2 at the transistor M2. That is, the voltage V1 at the transistor M1, which is located closer to the RF signal input terminal Rin has a higher value. Such a principle can be extended not only when the RF switch 1000 is formed of two transistors, but also when formed of three or more transistors. That is, among the plurality of transistors M1, M2, Mn-1, and Mn that form the RF switch, a voltage at a transistor disposed closer to the RF signal input terminal Rin has a higher value than a voltage at a transistor disposed away from the RF signal input terminal Rin. That is, the plurality of transistors M1, M2, . . . , Mn-1, and Mn are not equally distributed, so imbalance occurs. In particular, a high voltage may be applied to the transistor disposed close to the RF signal input terminal Rin, which may cause breakdown.

In order to solve such a problem, the RF switch 1000, in accordance with one or more embodiments, may set the distribution voltage of each transistor more evenly through two methods. A first method is a method that adjusts a gate length of a transistor according to a distance from the RF signal input terminal Rin. A second method is a method that adjusts an impedance value of the transistor according to the distance from the RF signal input terminal Rin. As described above with reference to FIG. 3A and FIG. 3B, since the impedance value of the transistor disposed closer to the RF signal input terminal has a larger value, the distribution voltage increases. Accordingly, the impedance value can be lowered by increasing the capacitance of the transistor disposed close to the RF signal input terminal RFin. Hereinafter, the two methods will be described in detail. The first method will be described with reference to FIG. 4 to FIG. 6, and the second method will be described with reference to FIG. 7A to FIG. 10.

Figure 4:
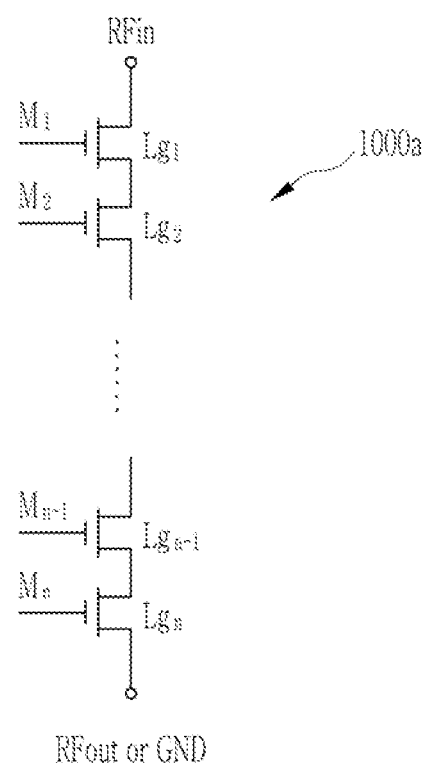
FIG. 4 illustrates an example RF switch 1000*a*, in accordance with one or more embodiments.

FIG. 4 illustrates an RF switch 1000a, in accordance with one or more embodiments. The RF switch 1000a of FIG. 4 adopts a method in which gate lengths of each transistor of the RF switch 1000a are set to be different from one another to thereby prevent occurrence of breakdown.

In FIG. 4, gate lengths Lg1, Lg2, . . . , Lgn-1, and Lgn respectively correspond to gate lengths of the plurality of transistor transistors M1, M2, . . . , Mn-1, and Mn. When the gate length is decreased, a figure of merit (FOM) is reduced, but a breakdown voltage is also reduced. That is, when the gate length is increased, the breakdown voltage is also increased. Thus, in another example, gate lengths of transistors are set to be different from each other according to a distance from an RF signal input terminal Rin. As described above, a breakdown voltage of a transistor that is located at a close distance from the RF signal input terminal Rin is decreased, and thus gate lengths of the transistors that are disposed close to the RF signal input terminal Rin may be increased in the present example. Such a gate length can be expressed mathematically as shown in Equation 1 below.

$$Lg_1 > Lg_2 \ldots Lg_{n-1} > Lg_n \quad \text{Equation 2:}$$

Meanwhile, unlike Equation 2, Lg1=Lg2, Lg2>Lgn-1, and Lgn-1=Lgn. That is, a gate length of a transistor that is disposed at a first distance from the RF signal input terminal RFin may be longer than a gate length of a transistor that is disposed at a second distance (here, the second distance is greater than the first distance). Meanwhile, the definition of the gate length will be described with reference to FIG. 5.

Figure 5:
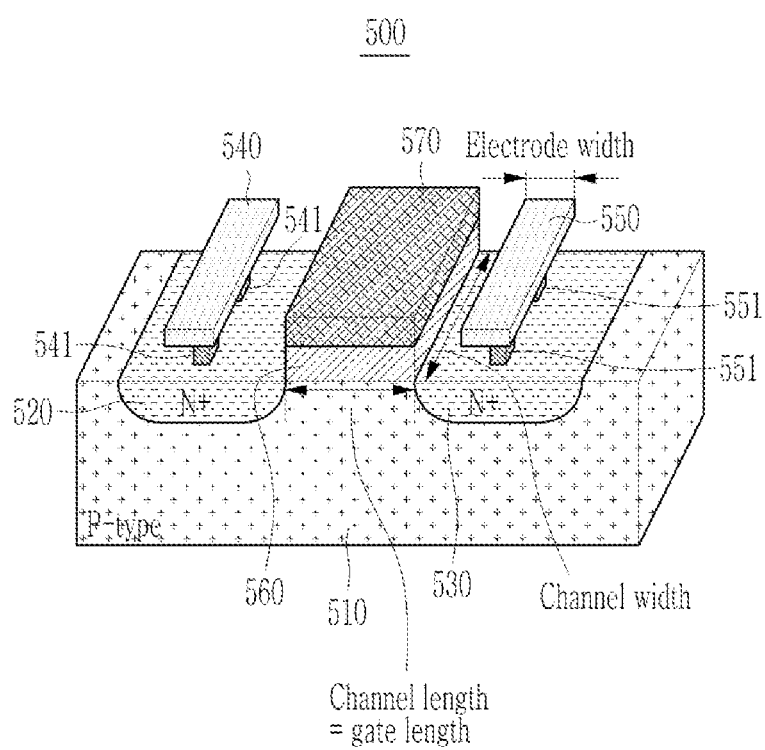
FIG. 5 illustrates an electric field effect transistor (FET) 500, in accordance with one or more embodiments.

FIG. 5 illustrates an electric field effect transistor (FET) 500 according to the exemplary embodiment. The electric field effect transistor 500 of FIG. 5 may correspond to each of the plurality of transistor transistors M1, M2, . . . , Mn-1, and Mn.

Referring to FIG. 5, the electric field effect transistor 500 may include a substrate 510, a drain region 520, a source region 530, a drain electrode 540, a source electrode 550, an insulating layer 560, and a gate electrode 570.

The substrate 510 may be a silicon substrate, and for example, it may be a P-type silicon substrate. The drain region 520 and the source region 530 are formed on the substrate 510. For example, when the substrate 510 is a P-type silicon substrate, an N-type region is doped on the P-type silicon substrate 510 such that the drain region 520 and the source region 530 may be formed.

The drain electrode 540 is formed on the drain region 520, and the source electrode 550 is formed on the source region 530. Here, a contact via 541 may be formed between the drain electrode 540 and the drain region 520, and the drain electrode 540 may be connected with the drain region 520 through the contact via 541. Meanwhile, the drain region 520 may be connected with the drain electrode 540 through the contact via 541, and thus may be connected with an electrode (e.g., a source electrode or a drain electrode) of another stage. In addition, a contact via 551 may be formed between the source electrode 550 and the source region 530, and the source electrode 550 may be connected with the source region 530 through the contact via 551. The source region 530 is connected with the source electrode 550 through the contact via 551, and thus may be connected with an electrode (e.g., a source electrode or a drain electrode) of another stage. In an example, the drain electrode 540 and the source electrode 550 may be formed of a metal. The contact via 541 may be provided in plural, and the contact via 551 may be provided in plural.

The insulating layer 560 may be formed on the substrate 510, and may cover an area that is disposed between the drain region 520 and the source region 530. The gate electrode 570 may be formed on the insulating layer 560. The gate electrode 570 may be formed of a polymer material or a metal.

As illustrated in FIG. 5, a gate length implies a distance between the drain region 520 and the source region 530 at a lower portion of the insulating layer 560. A channel region may be formed in a lower region of the insulating layer 560, and a distance between the drain region 520 and the source region 530 in the channel region is called a channel length. Accordingly, the gate length may correspond to the channel length. That is, the gate length may have the same meaning as the channel length. Additionally, a portion corresponding to the drain region 520 and the source region 530 in the channel region is called a channel width. Meanwhile, as shown in FIG. 5, an electrode width (i.e., a drain electrode width and a source electrode width) implies a length of the electrode in a direction corresponding to the channel length. Typically, the definition of length and width is defined based on current, and since a current flows from a drain to a source, the gate length, the channel length, the channel width, and the electrode width are defined as shown in FIG. 5. These definitions of gate length, channel length, channel width, and electrode width can be applied equally to the description below.

Figure 6:
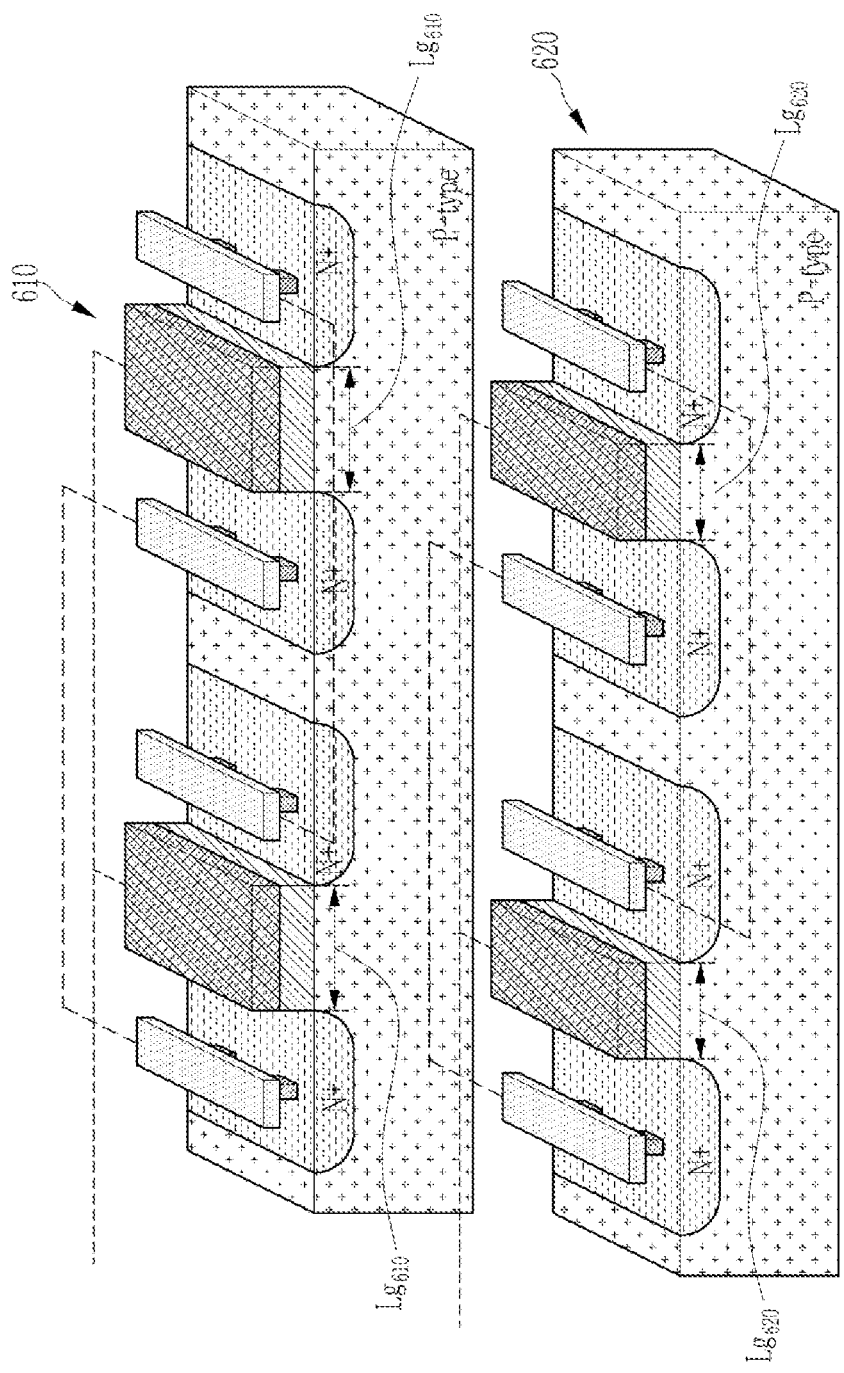
FIG. 6 illustrates two transistors in the example RF switch of FIG. 4, in accordance with one or more embodiments.

FIG. 6 illustrates two transistors in the RF switch of FIG. 4. That is, in FIG. 6, the reference numerals 610 and 620 respectively correspond to any one of the plurality of transistor transistors M1, M2, . . . , Mn-1, and Mn. Here, it is assumed that a transistor 610 is located closer to the RF signal input terminal RFin than a transistor 620.

As illustrated in FIG. 6, the transistor 610 may be a transistor with a number of fingers of 2, and the transistor 620 may also be a transistor with a number of fingers of 2. Since the transistors 610 and 620 have 2 fingers, as shown in FIG. 6, two gate electrodes are connected to each other, two drain electrodes are connected to each other, and two source electrodes are connected to each other. It is possible that the number of fingers of each transistor may have a number other than 2. A specific configuration of each transistor of FIG. 6 corresponds to the configuration of FIG. 5, and therefore a detailed description is omitted.

In FIG. 6, a gate length of the transistor 610 is denoted as Lg610, and a gate length of the transistor 620 is denoted as Lg620. Here, the gate length Lg610 of the transistor 610 may be a larger value than the gate length Lg610 of the transistor 620. That is, the gate length may satisfy the following Equation 3.

$$Lg_{610} > Lg_{620} \qquad \text{Equation 3:}$$

As described above, among the two transistors 610 and 620, a gate length for the transistor 610 disposed at a closer distance from the RF signal input terminal RFin is set to be larger than a gate length of the transistor 620, thereby increasing a breakdown voltage of the transistor 610. Since the breakdown voltage of the transistor 610 is increased by the gate length, breakdown of the RF switch 1000a can be prevented even through a high voltage is applied to the RF signal input terminal RFin. In other words, the breakdown voltage of the entire RF switch may be increased by setting the gate length for the transistor whose distribution voltage is set higher. Accordingly, the number of transistors that form the RF switch can be reduced, and the size of the RF switch can be reduced.

Hereinafter, referring to FIG. 7A to FIG. 10, a method for preventing breakdown by setting the impedance value of the transistor differently according to the distance from the RF signal input terminal Rin will be described. As described above, the impedance value of the transistor that is disposed close to the RF signal input terminal RFin in the plurality of transistors of the RF switch increases, thereby resulting in non-uniform voltage distribution. Accordingly, in the following example, the impedance value may be lowered by increasing the drain-source capacitance of the transistor disposed close to the RF signal input terminal RFin.

Figure 7A:
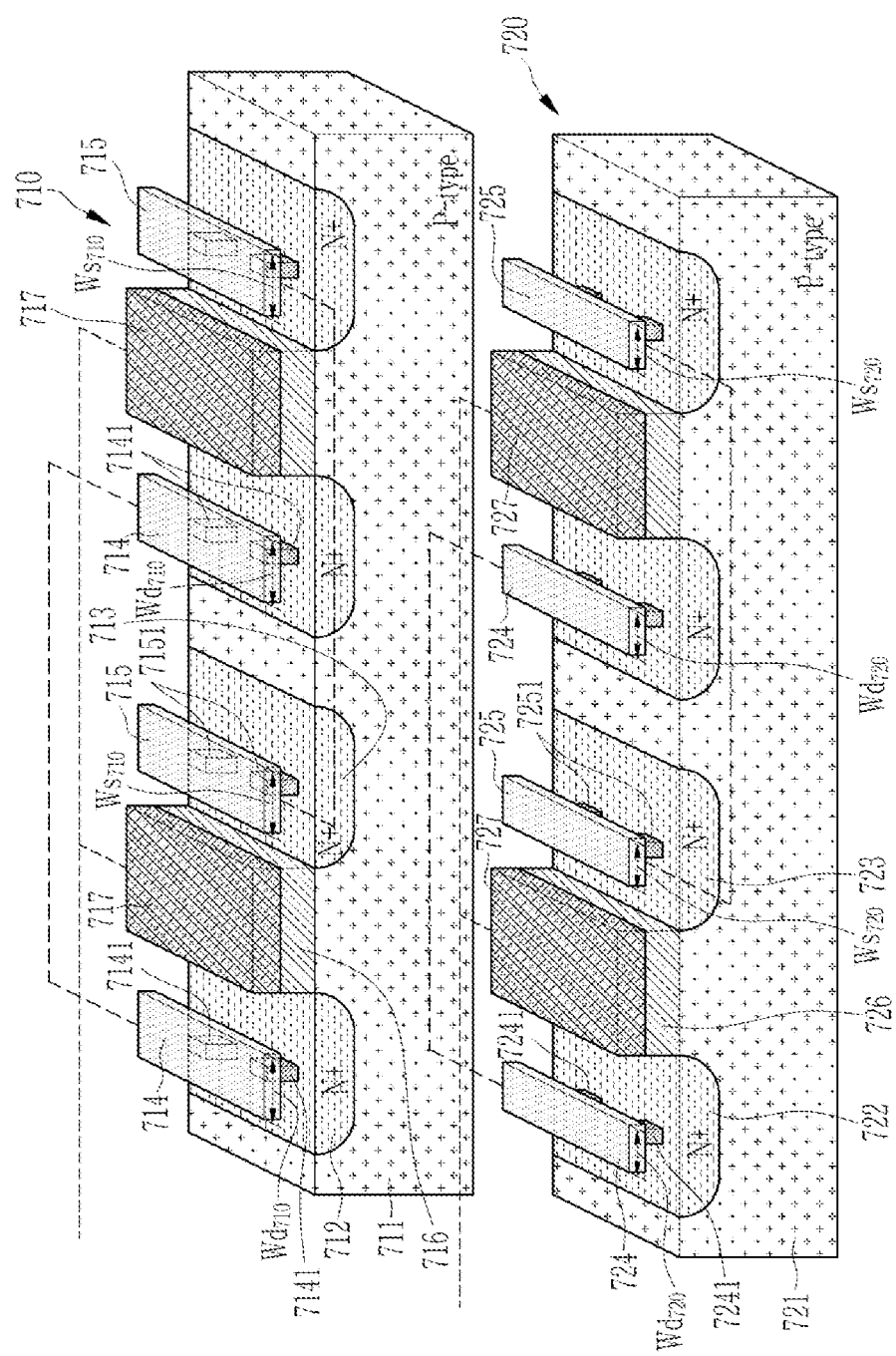
FIG. 7A and FIG. 7B illustrate a method for adjusting an impedance value, in accordance with one or more embodiments.
Figure 7B:
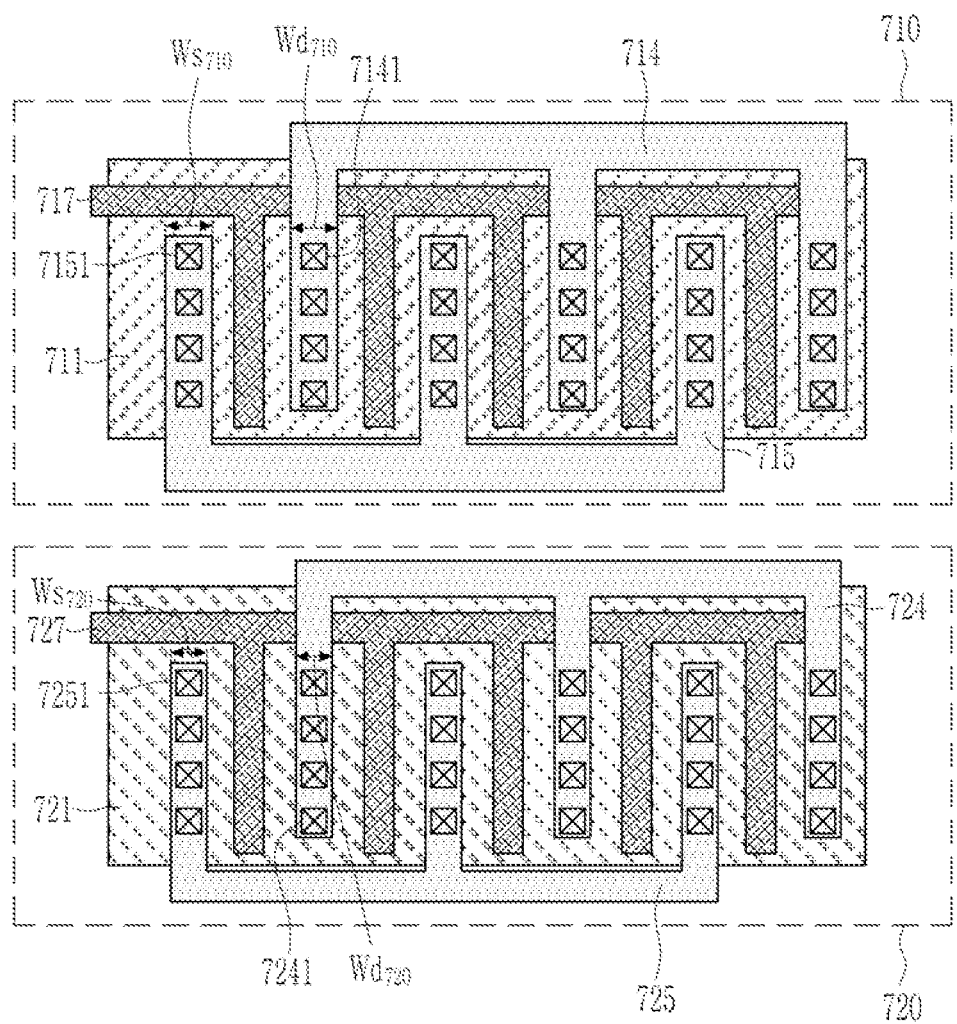

FIG. 7A and FIG. 7B illustrate a method for adjusting an impedance value, in accordance with one or more embodiments. In FIG. 7A and FIG. 7B, reference numerals 710 and 720 respectively denote one of the plurality of transistors M1, M2, . . . , Mn-1, and Mn of FIG. 2. In more detail, FIG. 7A is a perspective view of two transistors, and FIG. 7B is provided for description of a layout of FIG. 7A. In an example, it is assumed that the transistor 710 is disposed closer to the RF signal input terminal RFin than the transistor 720.

In an example, as illustrated in FIG. 7A, the transistor 710 may be a transistor with a number of fingers of 2, and the transistor 720 may also be a transistor with a number of fingers of 2. As illustrated in FIG. 7B, in a non-limiting example, the number of fingers of each transistor may have a number other than 2. The transistor 710 may include a substrate 711, a drain region 712, a source region 713, a drain electrode 714, a source electrode 715, an insulating layer 716, a gate electrode 717, and a plurality of contact vias 7141 and 7151. Additionally, the transistor 720 may include a substrate 721, a drain region 722, a source region 723, a drain electrode 724, a source electrode 725, an insulating layer 726, a gate electrode 727, and a plurality of contact vias 7241 and 7251. A specific configuration of each transistor of FIG. 7A corresponds to the configuration of FIG. 5, and therefore a detailed description is omitted.

In FIG. 7A and FIG. 7B, a drain electrode width of the transistor 710 is denoted with Wd710, and a source electrode width of the transistor 710 is denoted with Ws710. In addition, a drain electrode width of the transistor 720 is denoted with Wd720, and a source electrode width of the transistor 720 is denoted with Ws720. Since the drain and source are symmetrical to each other in one transistor, the drain electrode width and the source electrode width may be set equally within one transistor. That is, Wd710=Ws710, Wd720=Ws720. Accordingly, for convenience of explanation, the drain electrode width is described below as an example. However, the same can be applied to the source electrode width.

In accordance with an example, the drain electrode width Wd710 of the transistor 710 may have a larger value than the drain electrode width Wd720 of the transistor 720. That is, the width of the drain electrode may satisfy the following Equation 4.

$$Wd_{710} > Wd_{720} \qquad \text{Equation 4:}$$

As illustrated in Equation 4, among the two transistors 710 and 720, the drain electrode width of the transistor 710 that is disposed closer to the RF signal input terminal RFin is set to have a larger value, thereby reducing an impedance value of the transistor 710. When the width of the drain electrode 714 is increased, in the transistor 710, which is in the turn-off state, capacitance between the drain and the source and capacitance between the drain and the gate become larger and a resistance component is decreased. Since the capacitance value is increased and the resistance component is decreased, the impedance value of the transistor 710 decreases as shown in Equation 1. When the impedance value of the transistor 710 is decreased, the distribution voltage is also decreased, and thus breakdown of the transistor 710 can be prevented. That is, the impedance value of the transistor 710 is decreased, and accordingly, the distribution voltage for the transistor 710, which is likely to cause breakdown, may be lowered. That is, it is possible to increase the breakdown voltage of the entire RF switch by setting the drain electrode width for the transistor whose distribution voltage is set higher. Accordingly, the number of transistors forming the RF switch can be reduced, and the size of the RF switch can be reduced.

Figure 8A:
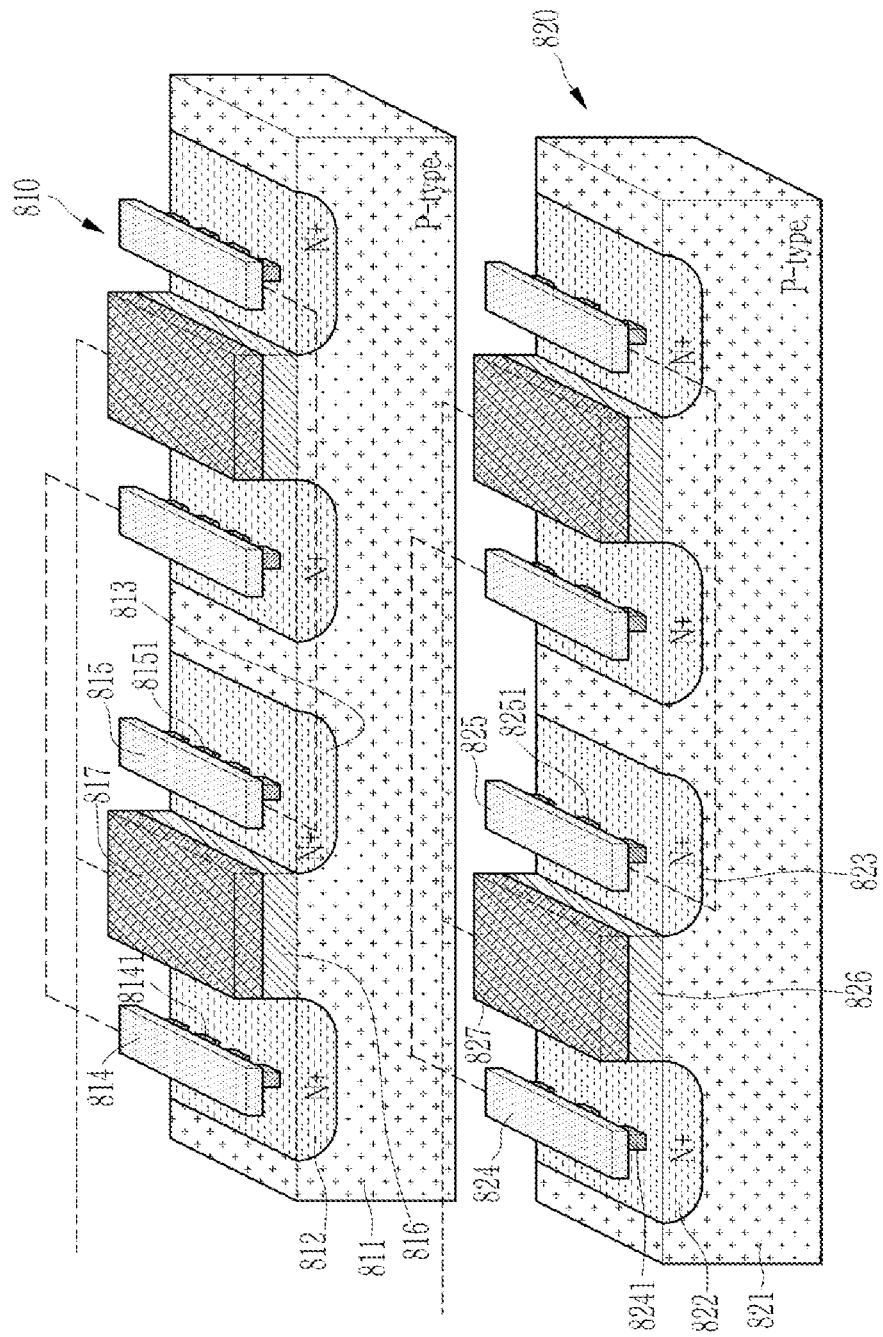
FIG. 8A and FIG. 8B illustrate a method that adjusts an impedance value, in accordance with one or more embodiments.
Figure 8B:
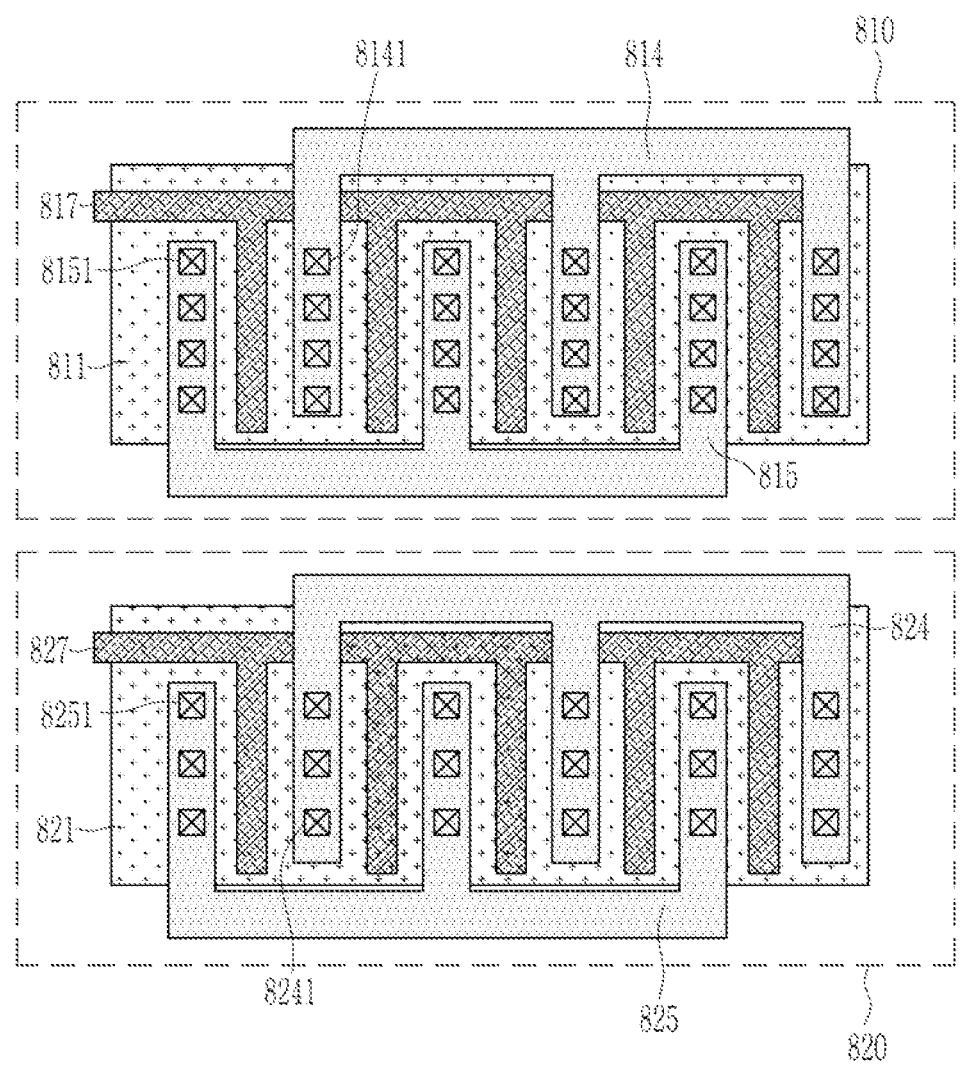

FIG. 8A and FIG. 8B illustrate a method of adjusting an impedance value, in accordance with one or more embodiments.

Referring to FIG. 8A and FIG. 8B, reference numerals 810 and 820 respectively denote one of the plurality of transistors M1, M2, . . . , Mn-1, and Mn of FIG. 2. Specifically, FIG. 8A is a perspective view of two transistors, and FIG. 8B is provided for description of a layout of FIG. 8A. Here, it is assumed that the transistor 810 is disposed closer to the RF signal input terminal RFin than the transistor 820.

As illustrated in FIG. 8A, in a non-limiting example, the transistor 810 may be a transistor with a number of fingers of 2, and the transistor 820 may also be a transistor with a number of fingers of 2. As illustrated in FIG. 8B, in an example, the number of fingers of each transistor may have a number other than 2. The transistor 810 may include a substrate 811, a drain region 812, a source region 813, a drain electrode 814, a source electrode 815, an insulating layer 816, a gate electrode 817, and a plurality of contact vias 8141 and 8151. Additionally, the transistor 820 may include a substrate 821, a drain region 822, a source region 823, a drain electrode 824, a source electrode 825, an insulating layer 826, a gate electrode 827, and a plurality of contact vias 8241 and 8251. A specific configuration of each transistor of FIG. 8A corresponds to the configuration of FIG. 5, and therefore a detailed description is omitted.

According to a non-limiting example, the number of the contact vias 8141 of the transistor 810 may be greater than the number of the contact vias 8241 of the transistor 820. That is, the number of contact vias 8141 formed in the drain electrode 814 may be greater than the number of contact vias 8241 formed in the drain electrode 824. In addition, the number of contact vias 8151 of the transistor 810 may be greater than the number of contact vias 8251 of the transistor 820. That is, the number of contact vias 8151 formed in the source electrode 815 may be greater than the number of contact vias 8251 formed in the source electrode 825.

Referring to FIG. 8A and FIG. 8B, although the number of contact vias formed in each electrode of the transistor 810 is 4 and the number of contact vias formed in each electrode of the transistor 820 is 3, they are not limited thereto.

As a portion (e.g., the number of contact vias) where the drain region and the source region contact the electrode is increased, capacitance between the drain and the source, capacitance between the drain and the gate, and capacitance between the source and the gate are also increased, and a resistance component is decreased. Since the capacitance value is increased and the resistance component is decreased, the impedance value of the transistor 810 is decreased as shown in Equation 1. When the impedance value of the transistor 810 is decreased, the distribution voltage is also decreased, and thus breakdown of the transistor 810 can be prevented. That is, the impedance value of the transistor 810 is decreased, and accordingly, the distribution voltage for the transistor 810, which is likely to cause breakdown, may be lowered. That is, it is possible to increase the breakdown voltage of the entire RF switch by setting the drain electrode width for the transistor whose distribution voltage is set higher. Accordingly, the number of transistors forming the RF switch can be reduced, and the size of the RF switch can be reduced.

Meanwhile, as illustrated in FIG. 8A and FIG. 8B, the impedance value can be adjusted by adjusting the number of contact vias, but the impedance value can also be adjusted by adjusting the entire area of the contact via. That is, the area of the entire contact vias 8141 and 8151 of the transistor 810 may be larger than the area of the entire contact vias 8241 and 8251 of the transistor 820.

Figure 9A:
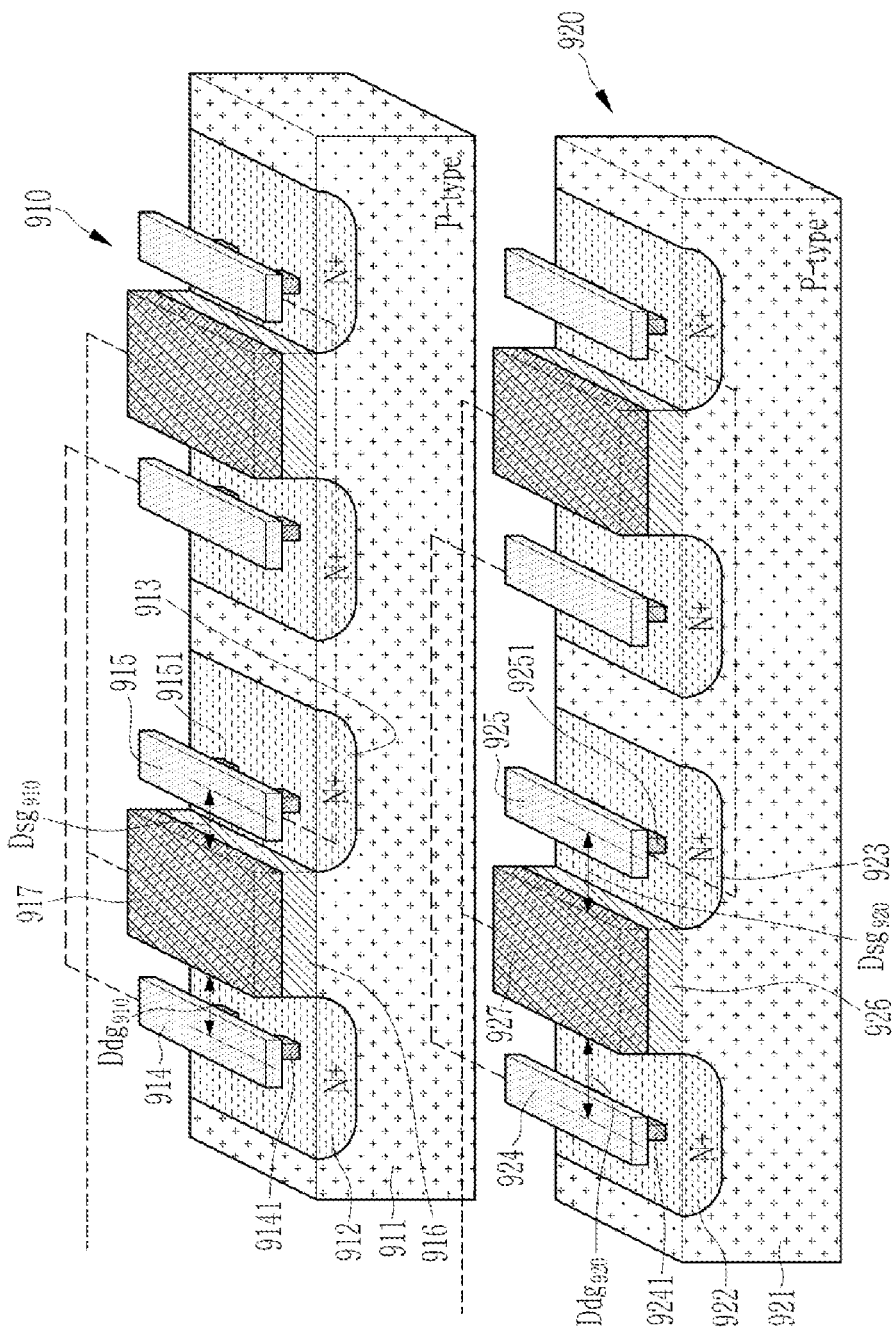
FIG. 9A and FIG. 9B illustrate a method that adjusts an impedance value, in accordance with one or more embodiments.
Figure 9B:
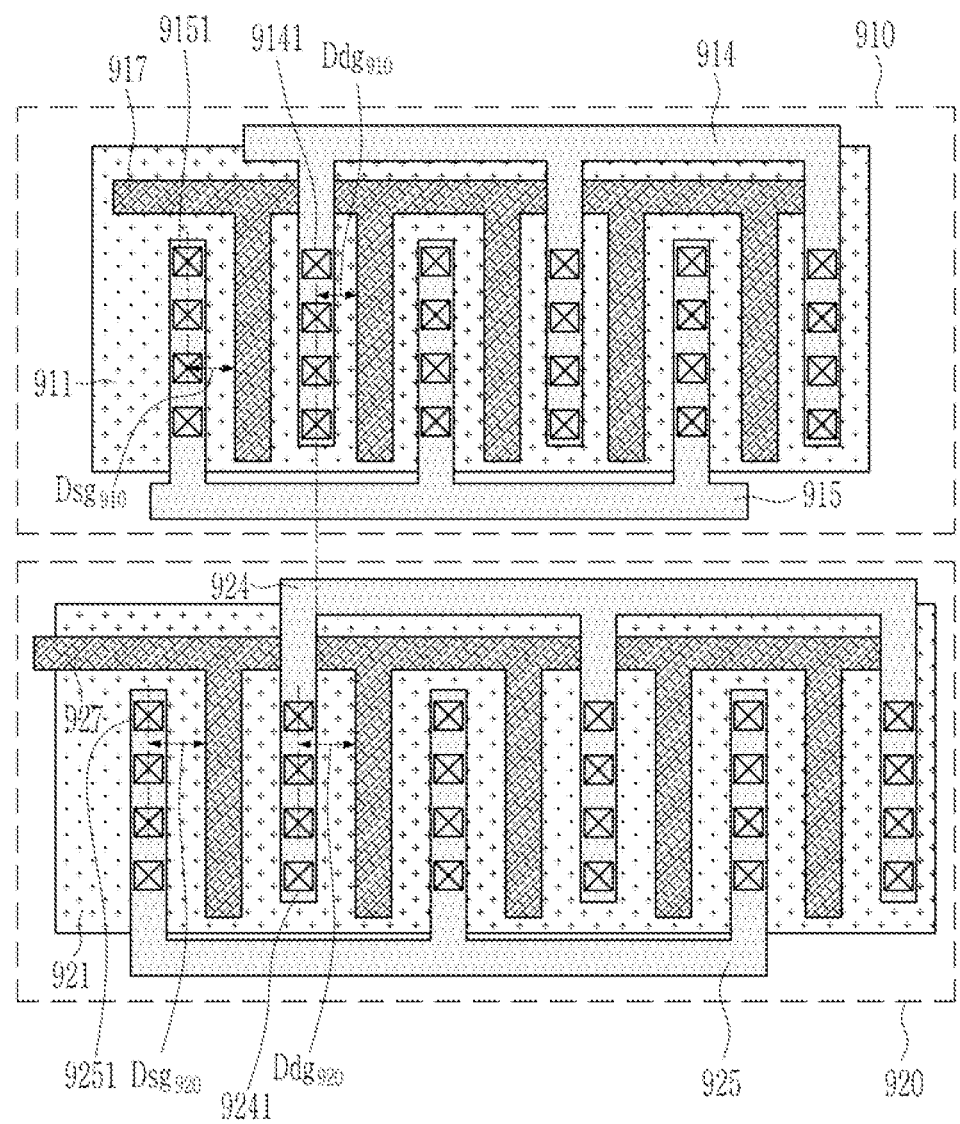

FIG. 9A and FIG. 9B illustrate a method that adjusts an impedance value of another exemplary embodiment. As shown in FIG. 9A and FIG. 9B, reference numerals 910 and 920 respectively denote one of the plurality of transistors M1, M2, . . . , Mn-1, and Mn of FIG. 2. In more detail, FIG. 9A is a perspective view of two transistors, and FIG. 9B is provided for description of a layout of FIG. 9A. Here, it is assumed that the transistor 910 is disposed closer to the RF signal input terminal RFin than the transistor 920.

As illustrated in FIG. 9A, in a non-limiting example, the transistor 910 may be a transistor with a number of fingers of 2, and the transistor 920 may also be a transistor with a number of fingers of 2. As illustrated in FIG. 9B, the number of fingers of each transistor may have a number other than 2. The transistor 910 may include a substrate 911, a drain region 912, a source region 913, a drain electrode 914, a source electrode 915, an insulating layer 916, a gate electrode 917, and a plurality of contact vias 9141 and 9151. Additionally, the transistor 920 may include a substrate 921, a drain region 922, a source region 923, a drain electrode 924, a source electrode 925, an insulating layer 926, a gate electrode 927, and a plurality of contact vias 9241 and 9251. A specific configuration of each transistor of FIG. 9A corresponds to the configuration of FIG. 5, and therefore a detailed description is omitted.

Referring to FIG. 9A and FIG. 9B, in each transistor, a distance from a contact point of a drain region and a drain electrode to a gate electrode is defined as Ddg. A distance from a contact point of the drain region 912 and the drain electrode 914 to the gate electrode 917 is denoted as $Ddg_{910}$. Here, the contact point of the drain region 912 and the drain electrode 914 may be a center point of the contact via 9141. Additionally, a distance from a contact point of the source region 913 and the source electrode 915 of the transistor 910 to the gate electrode 917 is denoted as $Dsg_{910}$. In an example, the contact point of the source region 913 and the source electrode 915 may be a center point of the contact via 9151. In addition, a distance (gap) from a contact point of the drain region 922 and the drain electrode 924 of the transistor 920 is denoted as $Ddg_{920}$, and a distance (gap) between the source region 923 and the source electrode 925 of the transistor 920 is denoted as $Dsg_{920}$. Since the drain and the source are symmetrical to each other in one transistor, $Ddg_{910}=Dsg_{910}$ and $Ddg_{920}=Dsg_{920}$. Accordingly, the following description is based on the drain electrode for convenience of explanation, but the same can be applied to the source electrode.

In accordance with an example, as shown in the following Equation 5, the distance Ddg 910 from the contact point of the drain region 912 and the drain electrode 914 of the transistor 910 to the gate electrode 917 may be smaller than the distance Ddg 920 from the contact point of the drain region 922 and the drain electrode 924 of the transistor 920 to the gate electrode 927.

$$Ddg_{910} < Ddg_{920} \qquad \text{Equation 5:}$$

As shown in Equation 5, among the two transistors 910 and 920, a drain-gate distance (i.e., the distance from the contact point of the drain region and the drain electrode to the gate electrode) of the transistor 910 that is disposed closer to the RF signal input terminal RFin is set to be smaller, such that an impedance value of the transistor 910 can be decreased. When the drain-gate distance is decreased, in the transistor 910, which is in the turn-off state, capacitance between the drain and the source and capacitance between the drain and the gate become larger and a resistance component is decreased. Since the capacitance is increased and the resistance component is decreased, the impedance value of the transistor 910 is decreased as shown in Equation 1. When the impedance value of the transistor 910 is decreased, the distribution voltage is also decreased, and thus breakdown of the transistor 710 can be prevented. That is, the impedance value of the transistor 910 is decreased, and accordingly, the distribution voltage for the transistor 910, which is likely to cause breakdown, may be lowered. That is, it is possible to increase the breakdown voltage of the entire RF switch by setting the drain electrode width for the transistor whose distribution voltage is set higher. Accordingly, the number of transistors forming the RF switch can be reduced, and the size of the RF switch can be reduced.

Meanwhile, in FIG. 9A and FIG. 9B, a spatial distance (gap) between the drain electrode and the gate electrode may be defined as Ddg.

FIG. 10 shows a gap between a drain electrode and a gate electrode, in accordance with one or more embodiments. As illustrated in FIG. 10, a spatial distance between the drain electrode and the gate electrode may be Ddg. In addition, a distance between a center point of the drain electrode and a center point of the gate electrode may be Ddg.

In an example, an impedance value can be adjusted by combining the method of FIG. 7A, the method of FIG. 8A, and the method of FIG. 9A. That is, the impedance value can be adjusted by applying at least one of the method of FIG. 7A, the method of FIG. 8A, and the method of FIG. 9A, and accordingly breakdown of the RF switch can be prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency (RF) switch configured to switch a RF signal input to a first terminal, the RF switch comprising:
    a first transistor, disposed at a first distance from the first terminal, and configured to switch the RF signal; and
    a second transistor, disposed at a second distance from the first terminal, and configured to switch the RF signal,
    wherein the first distance is shorter than the second distance,
    wherein a number of first contact vias formed in a first electrode in the first transistor is greater than a number of second contact vias formed in a second electrode of the second transistor,
    wherein a width of the first electrode of the first transistor is larger than a width of the second electrode of the second transistor, and
    wherein a distance between the first electrode of the first transistor and a control electrode of the first transistor is shorter than a distance between the second electrode of the second transistor and a control electrode of the second transistor.

2. The RF switch of claim 1, wherein the first contact via is a via that connects the first electrode and a the first transistor, and the doping area of the first transistor, and the second contact via is a via that connects the second electrode and a doping area of the second transistor.

3. The RF switch of claim 1, wherein an area of the first contact via is larger than an area of the second contact via.

4. The RF switch of claim 1, wherein the first transistor and the second transistor have a structure in which the first terminal and a second terminal of the RF switch are stacked.

5. The RF switch of claim 4, wherein an impedance value that corresponds to the first transistor when the first transistor is turned off, is smaller than an impedance value that corresponds to the second transistor when the second transistor is turned off.

6. A radio frequency (RF) switch configured to switch between a first terminal and a second terminal, the RF switch comprising:
    a first transistor, disposed at a first distance from the first terminal, and including a first control electrode to which a switching signal is applied; and
    a second transistor, disposed at a second distance from the first terminal, and including a second control electrode to which the switching signal is applied,
    wherein the first distance is shorter than the second distance, and a third distance between a first electrode of the first transistor and the first control electrode is shorter than a fourth distance between a second electrode of the second transistor and the second control electrode, and
    wherein a number of contact vias formed in the first electrode is greater than a number of contact vias formed in the second electrode.

7. The RF switch of claim 6, wherein the first electrode is at least one of a drain electrode and a source electrode of the first transistor, and the second electrode is at least one of a drain electrode and a source electrode of the second transistor.

8. The RF switch of claim 6, wherein the third distance is a distance from a contact point of the first electrode and a doping area of the first transistor to the first control electrode, and
    the fourth distance is a distance from a contact point of the second electrode and a doping area of the second transistor to the second control electrode.

9. The RF switch of claim 6, wherein the third distance is a spatial distance between the first electrode and the first control electrode, and the fourth distance is a spatial distance between the second electrode and the second control electrode.

10. The RF switch of claim 6, wherein a width of the first electrode is larger than a width of the second electrode.

11. The RF switch of claim 6, wherein the first transistor and the second transistor are coupled in series between the first terminal and the second terminal.

12. The RF switch of claim 6, wherein an impedance value corresponding to the first transistor when the first transistor is turned off is smaller than an impedance value corresponding to the second transistor when the second transistor is turned off.

13. The RF switch of claim 6, wherein an RF signal is applied to the first terminal and the second terminal is connected to ground.

14. The RF switch of claim 6, wherein an RF signal is applied to the first terminal and the second terminal is connected to an impedance element configured to provide an impedance value to an antenna.

* * * * *